(12) United States Patent
Ha

(10) Patent No.: US 11,533,446 B2
(45) Date of Patent: Dec. 20, 2022

(54) IMAGE SENSOR AND PHOTOGRAPHING APPARATUS INCLUDING THE SAME

(71) Applicant: SK hynix Inc., Icheon-si (KR)

(72) Inventor: Dong Ho Ha, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 4 days.

(21) Appl. No.: 17/154,936

(22) Filed: Jan. 21, 2021

(65) Prior Publication Data

US 2021/0289157 A1    Sep. 16, 2021

(30) Foreign Application Priority Data

Mar. 10, 2020 (KR) ........................ 10-2020-0029825

(51) Int. Cl.
| | |
|---|---|
| *H04N 5/378* | (2011.01) |
| *H04N 5/355* | (2011.01) |
| *H04N 5/376* | (2011.01) |
| *H04N 5/353* | (2011.01) |
| *H04N 5/374* | (2011.01) |
| *H01L 27/146* | (2006.01) |
| *H04N 5/3745* | (2011.01) |
| *H01L 27/148* | (2006.01) |

(52) U.S. Cl.
CPC ....... *H04N 5/378* (2013.01); *H01L 27/14612* (2013.01); *H01L 27/14643* (2013.01); *H01L 27/14831* (2013.01); *H04N 5/3532* (2013.01); *H04N 5/3559* (2013.01); *H04N 5/3765* (2013.01); *H04N 5/37452* (2013.01)

(58) Field of Classification Search
CPC .... H04N 5/378; H04N 5/3559; H04N 5/3765; H04N 5/3532; H04N 5/343; H04N 5/3745; H04N 5/374; H04N 5/37452; H01L 27/14643; H01L 27/14612; H01L 27/14831
See application file for complete search history.

(56) References Cited

U.S. PATENT DOCUMENTS

| | | | |
|---|---|---|---|
| 8,525,287 B2* | 9/2013 | Tian | H01L 31/00 257/440 |
| 9,942,503 B2 | 4/2018 | Velichko | |
| 2017/0099446 A1* | 4/2017 | Cremers | H04N 5/3559 |
| 2017/0207257 A1* | 7/2017 | Nishihara | H01L 27/1461 |
| 2017/0244921 A1* | 8/2017 | Velichko | H04N 5/378 |
| 2017/0339327 A1* | 11/2017 | Koshkin | H04N 5/2355 |
| 2018/0191969 A1 | 7/2018 | Innocent et al. | |
| 2019/0014273 A1 | 1/2019 | Geurts | |
| 2019/0215471 A1* | 7/2019 | Oh | H04N 3/14 |
| 2021/0408094 A1* | 12/2021 | Jang | G01S 3/01 |

* cited by examiner

*Primary Examiner* — Marly S Camargo

(74) *Attorney, Agent, or Firm* — Perkins Coie LLP

(57) ABSTRACT

An image sensor may include: a pixel array including a plurality of pixels; and a timing controller configured to control the pixel array according to an operation mode of the pixel array. The operation mode may be any one of a first mode in which the plurality of pixels operate according to a global shutter method and a second mode in which the plurality of pixels operate according to a dual conversion gain method.

20 Claims, 9 Drawing Sheets

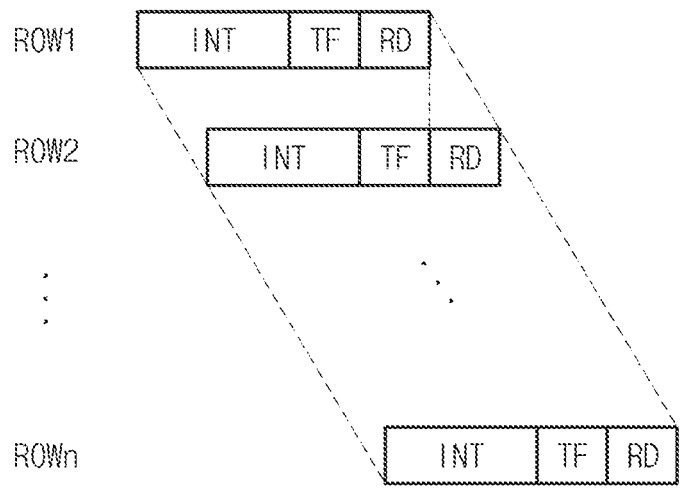
<Rolling Shutter>
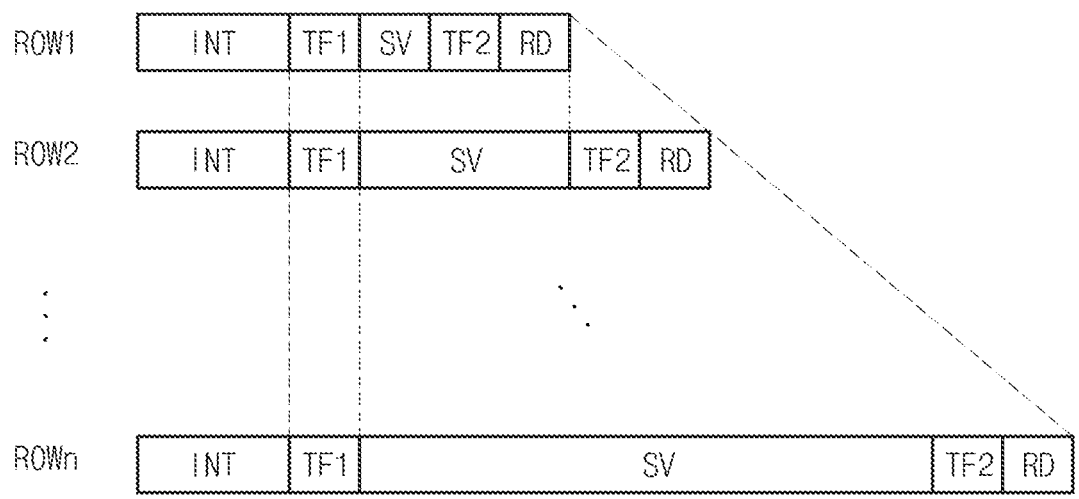
<Global Shutter>
FIG.2

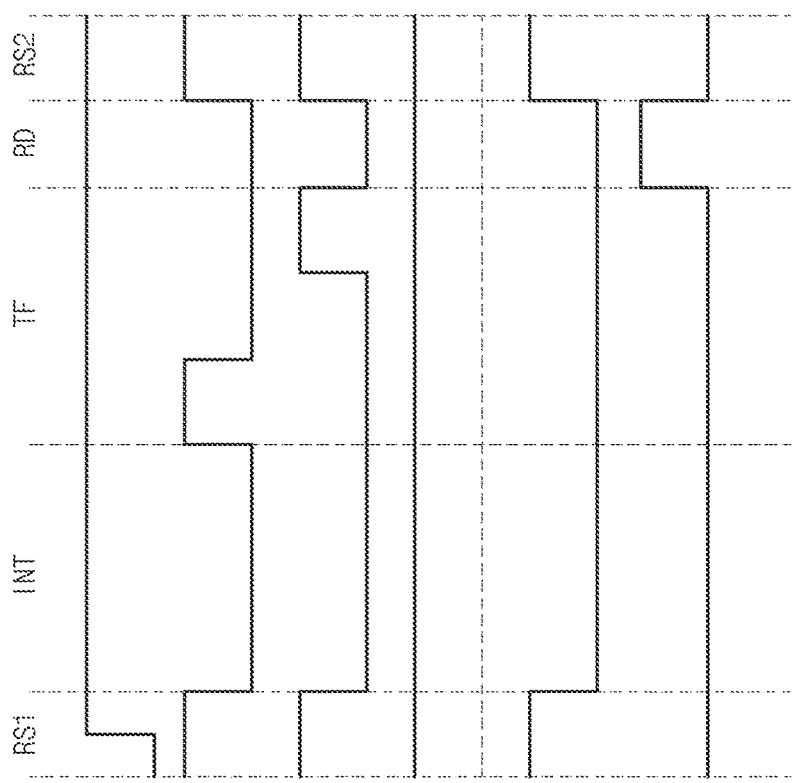
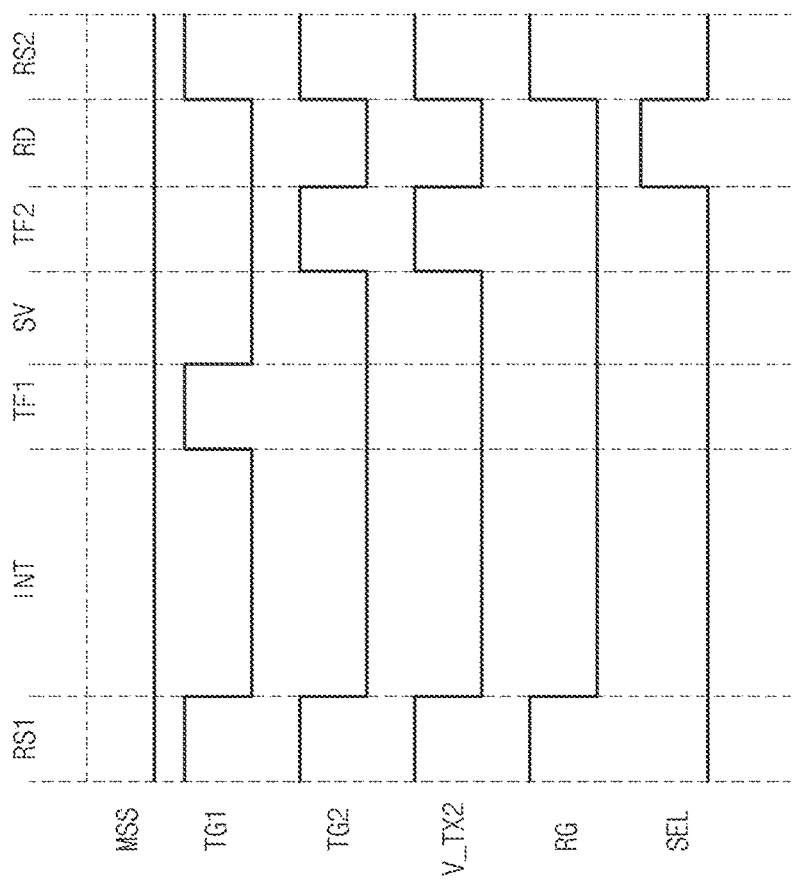
FIG. 9

IMAGE SENSOR AND PHOTOGRAPHING APPARATUS INCLUDING THE SAME

CROSS-REFERENCES TO RELATED APPLICATION

This patent document claims the priority and benefits of Korean application number 10-2020-0029825, filed on Mar. 10, 2020, which is incorporated herein by reference in its entirety.

TECHNICAL FIELD

The technology and implementations disclosed in this patent document generally relate to an image sensor including an additional storage element as well as a photo-electric conversion element, and a photographing apparatus including the same.

BACKGROUND

An image sensor is a device for capturing an image using the property of semiconductor that reacts to light that is incident thereon to produce an image. Recently, with the development of computer industry and communication industry, the demand for advanced image sensors has been increasing in various electronic devices such as smart phones, digital cameras, video game equipment, devices for use with IOT (Internet of Things), robots, security cameras and medical micro cameras.

The image sensors may be roughly divided into CCD (Charge Coupled Device) image sensors and CMOS (Complementary Metal Oxide Semiconductor) image sensors. CCD image sensors generate less noise and have better image quality than CMOS image sensors. However, CMOS image sensors have a simpler and more convenient driving scheme, and thus may be preferred in some applications. CMOS image sensors may integrate a signal processing circuit in a single chip, making it easy to miniaturize the sensors for implementation in a product, with the added benefit of consuming lower power consumption. CMOS image sensors can be fabricated using a CMOS fabrication technology, which results in low manufacturing cost. CMOS image sensing devices have been widely used due to their suitability for implementation in mobile devices.

SUMMARY

Various embodiments of the disclosed technology are directed to an image sensor and a photographing apparatus including the image sensor, which can use an additional storage element differently for each operation mode.

In an embodiment, an image sensor may include: a pixel array including a plurality of pixels; and a timing controller configured to control the pixel array according to an operation mode of the pixel array. The operation mode may be any one of a first mode in which the plurality of pixels operate according to a global shutter method and a second mode in which the plurality of pixels operate according to a dual conversion gain method.

In another aspect, an image sensor is provided to include: a pixel array including a plurality of pixels, each pixel structured to generate photocharges in response to incident light and including a floating diffusion region structured to accumulate the photocharges that is to be converted into an output voltage; and a controller coupled to communicate with the pixel array and structured to provide control signals to the pixel array to operate the pixel array in different first and second operation modes at different times in operating the pixel array to respond to incident light, wherein each pixel includes a storage element operable to store the photocharges generated by each pixel in either the first operation mode or the second operation mode based on the control signals, and wherein in the first operation mode the storage element stores the photocharges before transferring the photocharges to the floating diffusion region, and in the second operation mode the storage element stores the photocharges while providing an additional storage capacity to the floating diffusion region.

In an embodiment, a photographing apparatus may include: an image sensor comprising a plurality of pixels each configured to operate in any one of a first mode in which the pixel operates according to a global shutter method and a second mode in which the pixel operates according to a dual conversion gain method; and an image signal processor configured to decide the operation mode and generate a mode selection signal.

In another aspect, a photographic apparatus is provided to include: an image sensor comprising pixels each structured to operate in an operation mode that is one of a first mode in which the pixels operate according to a global shutter method and a second mode in which in which the pixels operate according to a dual conversion method; an image signal processor coupled to communicate with the image sensor and structured to determine which of the first mode and second mode to operate the image sensor and to generate a mode selection signal representing a determined mode out of the first and second modes.

In accordance with various embodiments, the image sensor and the photographing apparatus can implement a global shutter function and a double conversion gain function using only one additional storage element within a pixel.

BRIEF DESCRIPTION OF THE DRAWINGS

FIGS. 2A and 2B are diagrams for illustrating a rolling shutter configuration and a global shutter configuration of an image sensor of FIG. 1.

FIG. 9 is a timing diagram illustrating a control method for operating a pixel illustrated in FIG. 8 in a first mode and a second mode.

DETAILED DESCRIPTION

Figure 1:
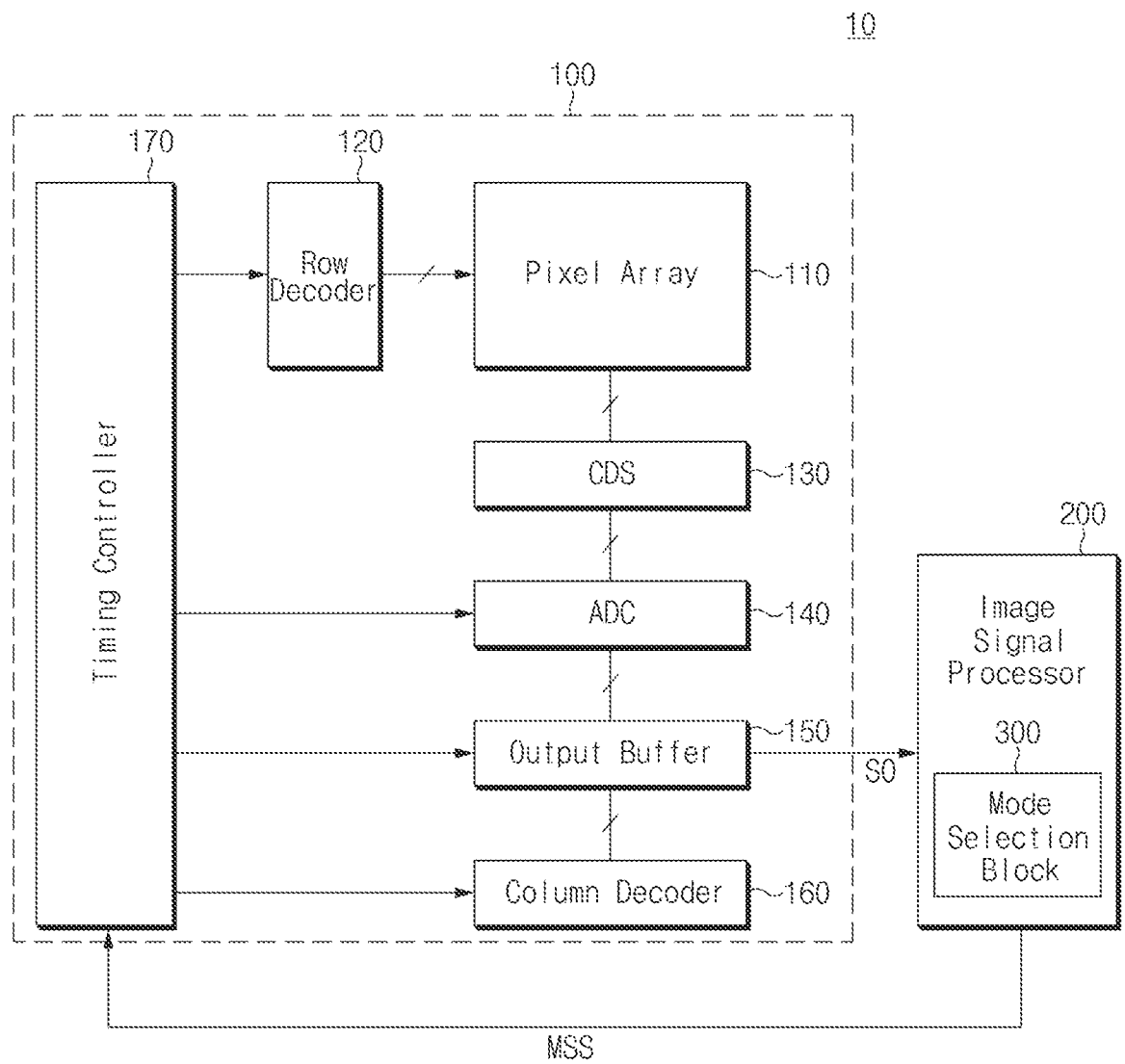
FIG. 1 is a diagram illustrating a photographing apparatus in accordance with an embodiment.
Figure 3:
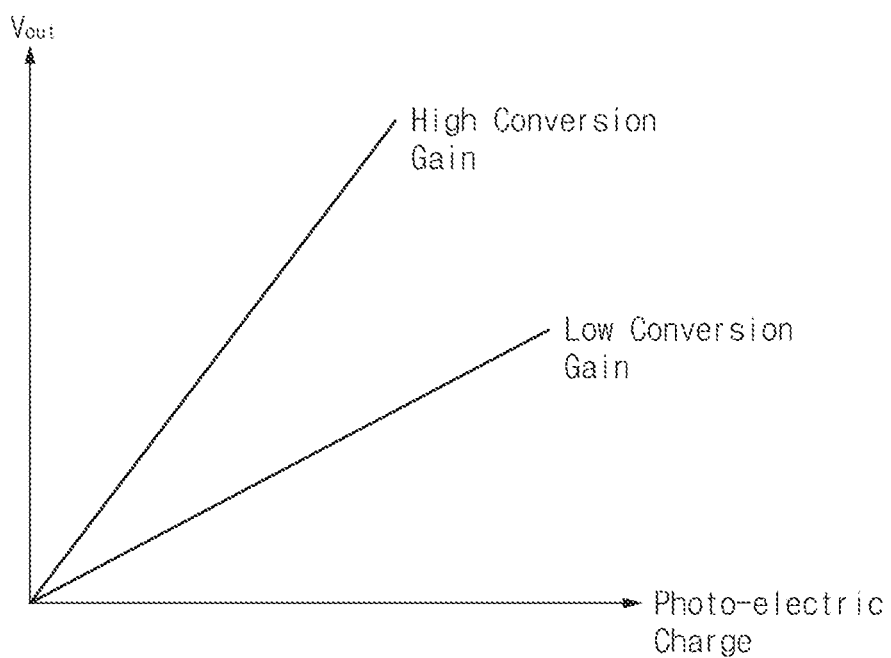
FIG. 3 illustrates graphs for explaining a high conversion gain and a low conversion gain.

Hereafter, various embodiments will be described with reference to the accompanying drawings. However, it should be understood that the disclosed technology is not limited to specific embodiments and various modifications, equivalents and/or alternatives of the embodiments can be made.

FIG. 1 is a diagram illustrating a photographing apparatus in accordance with an embodiment. FIGS. 2 and 3 are diagrams for describing an operation mode of an image sensor of FIG. 1.

Referring to FIG. 1, the photographing apparatus 10 may indicate an apparatus such as a digital still camera for capturing a still image or a digital video camera for capturing a moving image. For example, the photographing apparatus 10 may be implemented as a DLSR (Digital Single Lens Reflex) camera, a mirrorless camera or a mobile phone (specifically, a smart phone), but is not limited thereto. The photographing apparatus 10 may include an apparatus which includes a lens and an image pickup element and thus can generate an image by photographing an object.

The photographing apparatus 10 may include an image sensor 100 and an image signal processor 200.

The image sensor 100 may be a CIS (Complementary Metal Oxide Semiconductor Image Sensor) which converts an optical signal into an electrical signal. The image sensor 100 may provide the image signal processor 200 with image data obtained by converting an optical signal into an electrical signal, and the on/off, the operation mode and the sensitivity of the image sensor 100 may be controlled by the image signal processor 200.

The image sensor 100 may include a pixel array 110, a row decoder 120, a CDS (Correlate Double Sampler) 130, an ADC (Analog-Digital Converter) 140, an output buffer 150, a column decoder 160 and a timing controller 170.

The pixel array 110 may include a plurality of unit pixels arranged in a two-dimensional matrix including a plurality of rows and a plurality of columns. The plurality of unit pixels may convert an optical signal into an electrical signal. The conversion from the optical signal to the electrical signal can be performed in each unit pixel or in a shared pixel structure including two or more unit pixels which share one or more elements. Each of the unit pixels or the shared pixel structure may correspond to a 3T pixel, 4T pixel or 5T pixel, but the present embodiment is not limited thereto. The pixel array 110 may receive, from the row decoder 120, a driving signal that includes a row selection signal, a pixel reset signal and a transfer signal. The pixel array 110 may operate based on the driving signal.

The row decoder 120 may drive the pixel array 110 in response to a signal from the timing controller 170. For example, the row decoder 120 may select one or more rows of the pixel array 110. The row decoder 120 may generate a row selection signal to select one or more rows among the plurality of rows. The row decoder 120 may sequentially enable the pixel reset signal and the transfer signal for pixels corresponding to the selected one or more rows. Thus, reference signals and image signals, which are analog signals generated from the pixels of the selected one or more rows, may be sequentially transferred to the CDS 130. The reference signal and the image signal may be collectively referred to as a pixel signal.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the CDS 130 may sequentially sample and hold the reference signals and the image signals, which are provided from the pixel array 110 through a plurality of column lines, respectively. That is, the CDS 130 may sample and hold the levels of the reference signals and the image signals which correspond to the respective columns of the pixel array 110.

The CDS 130 may transfer the reference signal and the image signal of each of the columns as a CDS signal to the ADC 140 under control of the timing controller 170.

The ADC 140 may convert the CDS signal for each of the columns, outputted from the CDS 130, into a digital signal and output the digital signal. The ADC 140 may perform a counting operation and a computing operation based on the CDS signal for each of the columns and a ramp signal provided from the timing controller 170, and thus generate digital image data from which noise corresponding to each of the columns, for example, unique reset noise of each pixel, has been removed.

The ADC 140 may include a plurality of column counters corresponding to the respective columns of the pixel array 110, and generate the image data by converting the CDS signals corresponding to the respective columns into digital signals using the column counters. According to another embodiment, the ADC 140 may include one global counter, and convert the CDS signals corresponding to the respective columns into digital signals using a global code provided from the global counter.

The output buffer 150 may capture the column-based image data provided from the ADC 140, and output the captured image data.

The output buffer 150 may temporarily store the image data outputted from the ADC 140 under control of the timing controller 170. The output buffer 150 may operate as an interface which compensates for a difference in transfer or processing speed from another device coupled to the image sensor 100.

The column decoder 160 may select a column of the output buffer 150 under control of the timing controller 170, and sequentially output the image data which are temporarily stored in the selected column of the output buffer 150. For example, the column decoder 160 may receive an address signal from the timing controller 170, generate a column selection signal based on the address signal, and select a column of the output buffer 150, such that the image data stored in the selected column of the output buffer 150 is outputted as an output signal SO.

The timing controller 170 may control the row decoder 120, the ADC 140, the output buffer 150 and the column decoder 160.

The timing controller 170 may provide the row decoder 120, the column decoder 160 and the output buffer 150 with a clock signal required for operations of the respective components of the image sensor 100, a control signal for timing control, and address signals for selecting a row or column. According to an embodiment, the timing controller 170 may include a logic control circuit, a phase locked loop (PLL) circuit, a timing control circuit, a communication interface circuit or others.

The image sensor 100 may operate in any one of two operation modes including a first mode (e.g., global shutter (GS) mode) and a second mode (e.g., dual conversion gain (DCG) mode). The timing controller 170 of the image sensor 100 may receive a mode selection signal MSS from the image signal processor 200, and generate a control signal for operating in an operation mode corresponding to the mode selection signal MSS. The row decoder 120 may apply the control signal to the pixel array 110. Since the timing controller 170 provide information needed to generate the control signal, the timing controller 170 may control the pixel array 110 according to each of the operation modes.

FIGS. 2A and 2B illustrate two operation modes of the image sensor. FIG. 2A illustrates a rolling shutter method.

During the operations based on the rolling shutter method, each of the pixels may operate in an order of a photo-electric charge accumulation section INT, a transfer section TF, and a read section RD. The photo-electric charge accumulation section INT corresponds to a period for generating and accumulating photo-electric charge corresponding to the intensity of incident ray, a transfer section TF corresponds to a period for transferring the accumulated photo-electric charge to a floating diffusion region, and a read section RD corresponds to a period for generating an electrical signal corresponding to the photo-electric charge transferred to the floating diffusion region. In some implementations, a reset section for removing photo-electric charges remaining in the pixel may be further added. However, the descriptions thereof will be omitted herein for concise descriptions.

As described above, the pixel array 110 may include first to $n^{th}$ rows ROW1 to ROWn where n is an integer equal to or more than 2. In the first row ROW1, the photo-electric charge accumulation section INT, the transfer section TF and the read section RD may be sequentially performed. In the second row ROW2, the photo-electric charge accumulation section INT may be started after a predetermined time has elapsed from the start point of the photo-electric charge accumulation section INT of the first row ROW1. The predetermined time may be decided in consideration of the length of the read section RD. For example, the predetermined time may be equal to or more than the read section RD. The predetermined time for kth (k is one of 2 to n) row may mean the time between the start point of the photo-electric charge accumulation section INT of the first row ROW1 and a start point of the photo-electric charge accumulation section INT of the kth row. The predetermined time may be gradually increased as the row number increases from 2 to n. Increasing the predetermined time is to prevent two or more rows from outputting pixel signals in the same time section, because the first to $n^{th}$ row ROW1 to ROWn share signal processing circuits (CDS, ADC and the like) and a column line from which the pixel signals are outputted. Therefore, the operations are performed such that after the read section RD of the first row ROW1 is ended, the read section Rd of the second row ROW2 may be started. Thus, in two adjacent rows, the read section RD of the following row starts after the read section Rd of the previous rwo is ended. In each of the rows, the photo-electric charge accumulation section INT, the transfer section TF and the read section RD may be sequentially performed in the same manner.

According to the rolling shutter method, the first to $n^{th}$ rows ROW1 to ROWn capture photo-electric charges at different timings (or different time sections). Thus, when a dynamic image is captured, noise may be generated by an afterimage.

FIG. 2B illustrates a global shutter method. In the global shutter method, each of the pixels may operate in order of a photo-electric charge accumulation section INT for generating and accumulating photo-electric charge corresponding to the intensity of incident ray, a first transfer section TF1 for transferring the accumulated photo-electric charge to a storage diode capable of storing the photo-electric charge therein, a storage section SV for storing the photo-electric charge in the storage diode, a second transfer section TF2 for transferring the stored photo-electric charge to a floating diffusion region, and a read section RD for generating an electrical signal corresponding to the photo-electric charge transferred to the floating diffusion region, in order to generate image data for an object. In some implementations, a reset section for removing photo-electric charges remaining in the pixel may be further added.

However, the descriptions thereof will be omitted herein for concise descriptions.

In the first row ROW1, the photo-electric charge accumulation section INT, the first transfer section TF1, the storage section SV, the second transfer section TF2 and the read section RD may be sequentially performed. Unlike the rolling shutter method, according to the global shutter method, the photo-electric charge accumulation section INT and the first transfer section TF1 of the second row ROW2 may be performed at the same time as those of the first row ROW1. In this manner, in rows ROW1 to ROWn, each of the photo-electric charge accumulation section INT and the first transfer section TF1 is simultaneously performed. In the global shutter method, it is the storage section SV that varies in the respective rows ROW1 to ROWn. For example, the storage section SV of the second row ROW2 may be longer by a predetermined time than the storage section SV of the first row ROW1. The predetermined time may be decided in consideration of the lengths of the second transfer section TF2 and the read section RD. For example, the predetermined time may be equal to or more than the sum of the second transfer section TF2 and the read section RD. The predetermined time may be gradually increased as the row number increases from 1 to n. Increasing the predetermined time is to prevent two or more rows from outputting pixel signals in the same time section, because the first to $n^{th}$ row ROW1 to ROWn share signal processing circuits (CDS, ADC and the like) and a column line from which the pixel signals are outputted. Therefore, after the read section RD of the first row ROW1 is ended, the second transfer section TF2 of the second row ROW2 may be started. Thus, in two adjacent rows, the second transfer section TF2 of the following row starts after the read section RD of the previous rwo is ended. In each of the rows, the second transfer section TF2 and the read section RD may be sequentially performed in the same manner.

According to the global shutter method, the first to $n^{th}$ rows ROW1 to ROWn capture photo-electric charges at the same timing (or time section). Thus, no afterimage is generated even when a dynamic image is captured. Furthermore, in the global shutter method, the photo-electric charge accumulation section INT may be set as short as possible, such that a dynamic scene can be reliably captured. However, since an element for temporarily storing photo-electric charge (for example, storage diode) needs to be additionally included in each of the pixels, an area for the element may be increased.

FIG. 3 illustrates graphs to explain a high conversion gain and a low conversion gain. The conversion gain may indicate photo-electric conversion efficiency corresponding to the ratio of photo-electric charge converted into an electrical signal (for example, a voltage Vout). In FIG. 3, the X-axis may indicate the amount of photo-electric charges which are generated by incident ray and accumulated in a corresponding pixel, and the Y-axis may indicate an output voltage of a pixel.

The pixel having the high conversion gain has a relatively high ratio (e.g., slope) of output voltage to photo-electric charges. The pixel having the low conversion gain has a relatively low ratio (e.g., slope) of output voltage to photo-electric charges. Thus, for the same photo-electric charge, the output voltage may be higher at the high conversion gain than at the low conversion gain. For an object having relatively high luminance, the low conversion gain may be advantageously used. For an object having relatively low luminance, the high conversion gain may be advantageously used.

The DCG (Dual Conversion Gain) method refers to a method which can acquire an HDR (High Dynamic Range) image using both of the high conversion gain and the low conversion gain. When a high-luminance object and a low-luminance object are present together in one scene, the low-luminance object may be normally photographed in an image acquired by using only the high-conversion gain, but blur may occur for the high-luminance object. Furthermore, the high-luminance object may be normally photographed in an image acquired by using only the low-conversion gain, but the low-luminance object may appear dark. However, when the DCG method is used, both of the high-luminance object and the low-luminance object may appear clearly in an HDR image obtained by synthesizing the image acquired through the high-conversion gain and the image acquired through the low-conversion gain.

An SCG (Single Conversion Gain) method refers to a method for acquiring an image using only one conversion gain (for example, the high-conversion gain). The SCG method has a disadvantage in that objects having large luminance differences are included in one scene, or an image cannot be normally acquired in a specific luminance environment (for example, high-luminance or low-luminance environment).

In the DCG method, even an image with high contrast can be normally acquired. However, since an element for implementing the low-conversion gain (for example, storage element) needs to be additionally included in each of the pixels, an area for the element is increased. Furthermore, since the DCG method requires two photographing operations using the high and low conversion gains, the DCG method may be more suitable for a static scene.

As described above, when the image sensor is used to operate according to the global shutter method (for example, to capture a dynamic scene), the photo-electric charge accumulation section (or exposure time) may be set as short as possible. In this case, e.g., when the photo-electric charge accumulation section is set as short as possible, it is highly unlikely that a high-luminance object will be present in the scene. Therefore, when the image sensor is used to operate according to the global shutter method, the DCG method is rarely used by the image sensor.

When the image sensor is used to operate according to the DCG method (for example, to capture a scene with high contrast), due to the characteristic of the DCG method which requires two photographing operations, it is advantageous to capture a static scene. Therefore, when the image sensor is used to operate according to the DCG method, the global shutter method is rarely used by the image sensor.

Thus, the situation in which photographing needs to be performed through the global shutter method and the situation in which the photographing needs to be performed through the DCG method do not occur substantially at the same time. Rather, the two situations occur in different environments.

In recognition of the above, the disclosed technology provides an image sensor 100 including one storage element in a pixel, which can be used for both the global shutter method and the DCG method. Both of the global shutter method and the DCG method require an additional storage element within a pixel. By providing one storage element instead of two separate elements that are used for the respective operations according to the global shutter method and the DCG method, it is possible to minimize an area used for a pixel array and simplify fabrication process. In the image sensor 100 in accordance with the present embodiment, one storage element may be added to a pixel, and usable for both cases of the global shutter method or the DCG method. Thus, depending on situation, the storage element added to the pixel is used for the pixel operating according to the global shutter method or used for the pixel operating according to the DCG method.

In the first mode (or GS mode) in which the storage element is used for the global shutter method, each of the pixels may operate according to the global shutter method and the SCG (or high conversion gain) method. On the other hand, in the second mode (or DCG mode) in which the storage element is used for the DCG (or low-conversion gain) method, each of the pixels may operate according to the rolling shutter method and the DCG (low-conversion gain) method. The operations of the pixel in the first and second modes will be described below in detail with reference to FIG. 4 and the followings.

Referring back to FIG. 1, the image signal processor 200 may process image data inputted from the image sensor 100, and control the image sensor 100 according to the processing result or an external input signal. The image signal processor 200 may perform image signal processing such as gamma correction, color filter array interpolation, color matrix, color correction or color enhancement, in order to reduce noise of image data and to enhance the quality of the image. Furthermore, the image signal processor 200 may generate an image file by compressing the image data generated by performing image signal processing for image quality enhancement, or recover the image data from the image file. The image may be compressed in a reversible compression format or an irreversible compression format. As an example of the compression format, JPEG (Joint Photographic Experts Group) or JPEG 2000 may be used for a still image. In the case of a moving image, a moving image file may be generated by compressing a plurality of frames according to the MPEG (Moving Picture Experts Group) standard. The image file may be generated according to the Exif (Exchangeable image file format) standard, for example.

The image data outputted from the image signal processor 200 may be stored in an internal memory of the photographing apparatus 10 or an external memory or displayed through a display. The storage or the display of the image data may be performed with or without a request from a user.

The image signal processor 200 may perform one or more image processing operations on the captured images, including, at least one of unsharpness processing, blur processing, edge emphasis processing, image analysis processing, image recognition processing, image effect processing or others.

The image signal processor 200 may perform certain image signal processing operations related to displaying the captured images. For example, the image signal processor 200 may perform at least one of brightness level adjustment, color correction, contrast adjustment, contour emphasis adjustment, screen split, character image generation, image synthesis, or others.

The image signal processor 200 may include a mode selection block 300. The mode selection block 300 may decide an operation mode of the image sensor 100, generate a mode selection signal MSS corresponding to the decided operation mode, and transfer the mode selection signal MSS to the image sensor 100. The image sensor 100 may be operated in various operation modes including, e.g., the global shutter (GS) mode and the dual conversion gain (DCG) mode. In implementations, the mode selection signal may be a 1-bit digital signal. The mode selection signal corresponding to 0 may indicate the first mode (e.g., the GS mode), and the mode selection signal corresponding to 1 may indicate the second mode (e.g., the DCG mode).

According to an embodiment, the mode selection block 300 may decide the operation mode of the image sensor 100 based on a user's request or instruction. For example, on an application for photographing, a user may select a high-speed photographing mode for capturing a dynamic scene or the HDR mode for capturing an HDR image. Based on the input from the user, the mode selection block 300 may apply the operation mode of the image sensor 100 as the first or second mode.

According to another embodiment, the mode selection block 300 may decide the operation mode of the image sensor 100 based on image data generated by the image signal processor 200 without relying on a specific user input or instruction.

For example, the mode selection block 300 may decide the operation mode based on the magnitude of a motion vector of a previous frame. The motion vector may be a value indicating the moving distance and direction of a specific object, included in a specific frame, within a subsequent frame. The mode selection block 300 may compare the magnitude of the motion vector of the previous frame to a threshold magnitude, and decide the operation mode as the first mode when the magnitude of the motion vector in the previous frame is larger than the threshold magnitude, and decide the operation mode as the second mode when the magnitude of the motion vector in the previous frame is equal to or less than the threshold magnitude. The threshold magnitude may be experimentally decided according to whether photographing needs to be performed through the global shutter method. Furthermore, the magnitude of the motion vector of the previous frame may indicate the average value of the magnitudes of motion vectors of a plurality of previous frames.

In another example, the mode selection block 300 may decide the operation mode based on a contrast value of the previous frame. The contrast value may indicate a difference in brightness between a first object having the highest brightness and a second object having the lowest brightness in a specific frame. The first or second object may indicate a specific object or specific area (for example, 10 pixels×10 pixels). The mode selection block 300 may compare the contrast value of the previous frame to a threshold difference value, and decide the operation mode as the second mode when the contrast value of the previous frame is larger than the threshold difference value, and decide the operation mode as the first mode when the contrast value of the previous frame is equal to or smaller than the threshold difference value. The contrast value may be experimentally decided according to whether photographing needs to be performed through the DCG method. Furthermore, the contrast value of the previous frame may indicate the average value of contrast values of a plurality of previous frames.

In another example, the mode selection block 300 may decide the operation mode based on the average brightness of the previous frame. The average brightness may indicate average brightness calculated for pixels included in a specific frame. The mode selection block 300 may compare the average brightness of the previous frame to a threshold brightness value, and decide the operation mode as the second mode when the average brightness of the previous frame is larger than the threshold brightness value, and decide the operation mode as the first mode when the average brightness of the previous frame is equal to or smaller than the threshold brightness value. The average brightness may be experimentally decided according to whether photographing needs to be performed through the low-conversion gain. The average brightness of the previous frame may indicate the average value of the brightness levels of a plurality of previous frames.

In another example, the mode selection block 300 may decide the operation mode based on the magnitude of a motion vector of a previous frame and a contrast value (or average brightness) of the previous frame. That is, the mode selection block 300 may compare the magnitude of the motion vector of the previous frame to a threshold magnitude, and compare the contrast value of the previous frame to a threshold difference value. The mode selection block 300 may decide the operation mode as the first mode when the magnitude of the motion vector of the previous frame becomes larger than the threshold magnitude (first event), and decide the operation mode as the second mode when the contrast value of the previous frame becomes larger than the threshold difference value (second event). In this case, the mode selection block 300 may neither decide the operation mode as the second mode even though the magnitude of the motion vector of the previous frame is decreased to the threshold magnitude or less, nor decide the operation mode as the first mode even though the contrast value of the previous frame is decreased to the threshold difference value or less. That is, as long as the first or second event does not occur, the mode selection block 300 may retain the current operation mode.

In another embodiment, the mode selection block 300 may decide the operation mode of the image sensor 100 based on sensing data of a sensor unit (not illustrated). The sensor unit may include one or more of a luminance sensor, an acceleration sensor and a gyro sensor. The mode selection block 300 may decide the operation mode of the image sensor 100 based on motion data calculated by the acceleration sensor and the gyro sensor or luminance data of the luminance sensor. The method for deciding the operation mode based on motion data or luminance data corresponds to the above-described method for deciding the operation mode based on the magnitude of the motion vector of the previous frame or the contrast value of the previous frame. Thus, the detailed descriptions thereof will be omitted herein.

As illustrated in FIG. 1, the image signal processor 200 may include the mode selection block 300. According to another embodiment, the mode selection block 300 may be implemented as a separate device from the image signal processor 200.

Figure 4:
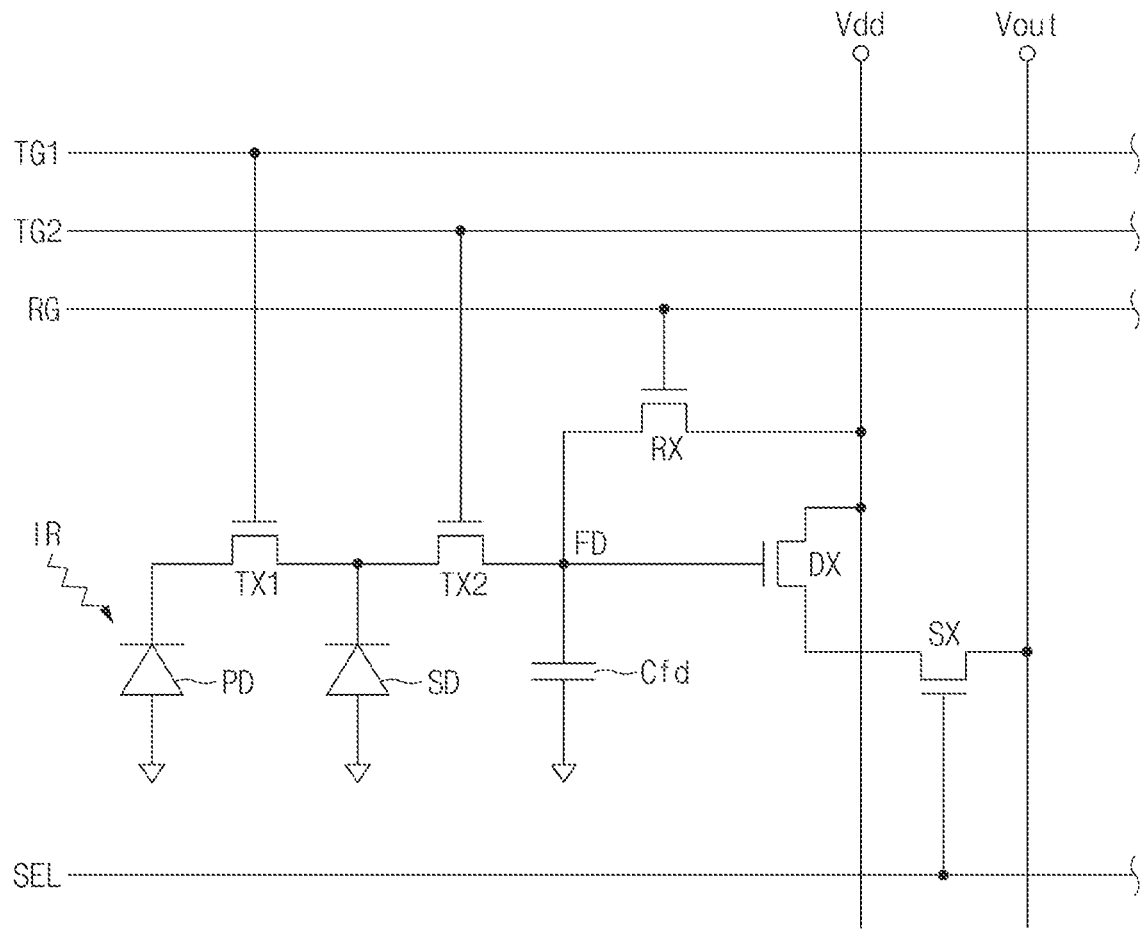
FIG. 4 is a diagram illustrating an example of an equivalent circuit of a pixel included in a pixel array illustrated in FIG. 1.

FIG. 4 is a diagram illustrating an example of an equivalent circuit of a pixel included in the pixel array illustrated in FIG. 1.

Referring to FIG. 4, a pixel PX-1 may correspond to a random unit pixel included in the pixel array 110. The pixel PX-1 may be a 5-TR pixel including a photodiode PD, a first transfer transistor TX1, a storage diode SD, a second transfer transistor TX2, a floating diffusion region FD, a reset transistor RX, a drive transistor DX and a selection transistor SX.

The photodiode PD is an example of a photo-electric conversion element, and may generate an electron-hole pair corresponding to incident ray IR according to a photo-electric effect, and generate and accumulate photo-electric charges corresponding to the intensity of the incident ray IR. According to another embodiment, the photodiode PD may be replaced with a phototransistor, a photo-gate, a pinned photodiode, or a combination thereof.

The first transfer transistor TX1 may be coupled between the photodiode PD and the storage diode SD, and receive a first transfer signal TG1 through a gate thereof. The first transfer transistor TX may be turned on according to the first transfer signal TG1 corresponding to logic high, or turned off according to the first transfer signal TG1 corresponding to logic low. When the first transfer transistor TX1 is turned on, the first transfer transistor TX1 may transfer the photo-electric charges accumulated in the photodiode PD, to the storage diode SD.

The storage diode SD may store the photo-electric charges transferred from the first transfer transistor TX1, or provide an additional storage capacity to the floating diffusion region FD. The storage diode SD may be implemented as a structure corresponding to the photodiode PD, and thus accumulate photo-electric charges like the photodiode PD. In the present embodiment, the storage diode SD is an example of a storage element capable of storing photo-electric charges, and may be replaced with another type of storage element (for example, pinned photodiode or capacitor). The storage diode SD may be formed not to receive any incident ray IR such that the storage diode SD is prevented from independently generating any photo-electric charges in response to the incident ray IR. In some implementations, the storage dido SD is formed with a shielding film so that the incident ray IR does not reach to the storage diode SD.

The second transfer transistor TX2 may be coupled between the storage diode SD and the floating diffusion region FD, and receive a second transfer signal TG2 through a gate thereof. The second transfer transistor TX2 may be turned on according to the second transfer signal TG2 corresponding to logic high, and turned off according to the second transfer signal TG2 corresponding to logic low. When the second transfer transistor TX2 is turned on, the second transfer transistor TX2 may transfer the photo-electric charges stored in the storage diode SD to the floating diffusion region FD, or couple the storage diode SD to the floating diffusion region FD so as to provide the storage capacity of the storage diode SD to the floating diffusion region FD.

The floating diffusion region FD is an area for converting photo-electric charges into a voltage, and may accumulatively store photo-electric charges using a junction capacitor Cfd. The floating diffusion region FD may be an area doped with a first conductive-type (for example, n-type) impurity within a semiconductor substrate, and the floating diffusion region FD and a second conductive-type (for example, p-type) impurity in the semiconductor substrate may be modeled as the junction capacitor Cfd. The floating diffusion region FD may have a storage capacity decided by the storage capacity of the junction capacitor Cfd. However, when the floating diffusion region FD is coupled to the storage diode SD by the operation of the second transfer transistor TX2, the storage capacity of the floating diffusion region FD may be decided by the storage capacity of the junction capacitor Cfd and the storage capacity of the storage diode SD.

Each of the photodiode PD, the storage diode SD and the junction capacitor Cfd may have one side coupled to a ground voltage terminal.

The reset transistor RX may be coupled between a supply voltage Vdd and the floating diffusion region FD, and receive a reset signal RG through a gate thereof. The reset transistor RX may be turned on according to the reset signal RG corresponding to logic high, or turned off according to the reset signal RG corresponding to logic low. When the reset transistor RX is turned on, the reset transistor RX may reset the voltage level of the floating diffusion region FD to the supply voltage Vdd.

The drive transistor DX may be coupled between the supply voltage Vdd and a selection transistor SX, and have a gate coupled to the floating diffusion region FD. Thus, the drive transistor DX may amplify a change in electrical potential of the photo-electric charges accumulated in the floating diffusion region FD, and transfer the amplified signal to the selection transistor SX.

The floating diffusion region FD may have two kinds of storage capacities according to the operation of the second transfer transistor TX2. That is, when the second transfer transistor TX2 is turned off, the floating diffusion region FD may have a storage capacity corresponding to the junction capacitor Cfd, and the ratio of photo-electric charges converted into the output voltage Vout to the accumulated photo-electric charges may be relatively high (high conversion gain). On the other hand, when the second transfer transistor TX2 is turned on, the floating diffusion region FD may have a storage capacity corresponding to the sum of the storage capacities of the junction capacitor Cfd and the storage diode SD, and the ratio of photo-electric charges converted into the output voltage Vout to the accumulated photo-electric charges may be relatively low (low conversion gain).

The selection transistor SX may be coupled between the drive transistor DX and a signal output line, and receive a selection signal SEL through a gate thereof. The selection transistor SX may function to select a pixel to be read on a row basis. The selection transistor SX may be turned on according to the selection signal SEL corresponding to logic high, or turned off according to the selection signal SEL corresponding to logic low. When the selection transistor SX is turned on, the selection transistor SX may output a signal, corresponding to a change in electrical potential of the floating diffusion region FD, as the output voltage Vout through the signal output line.

Figure 5:
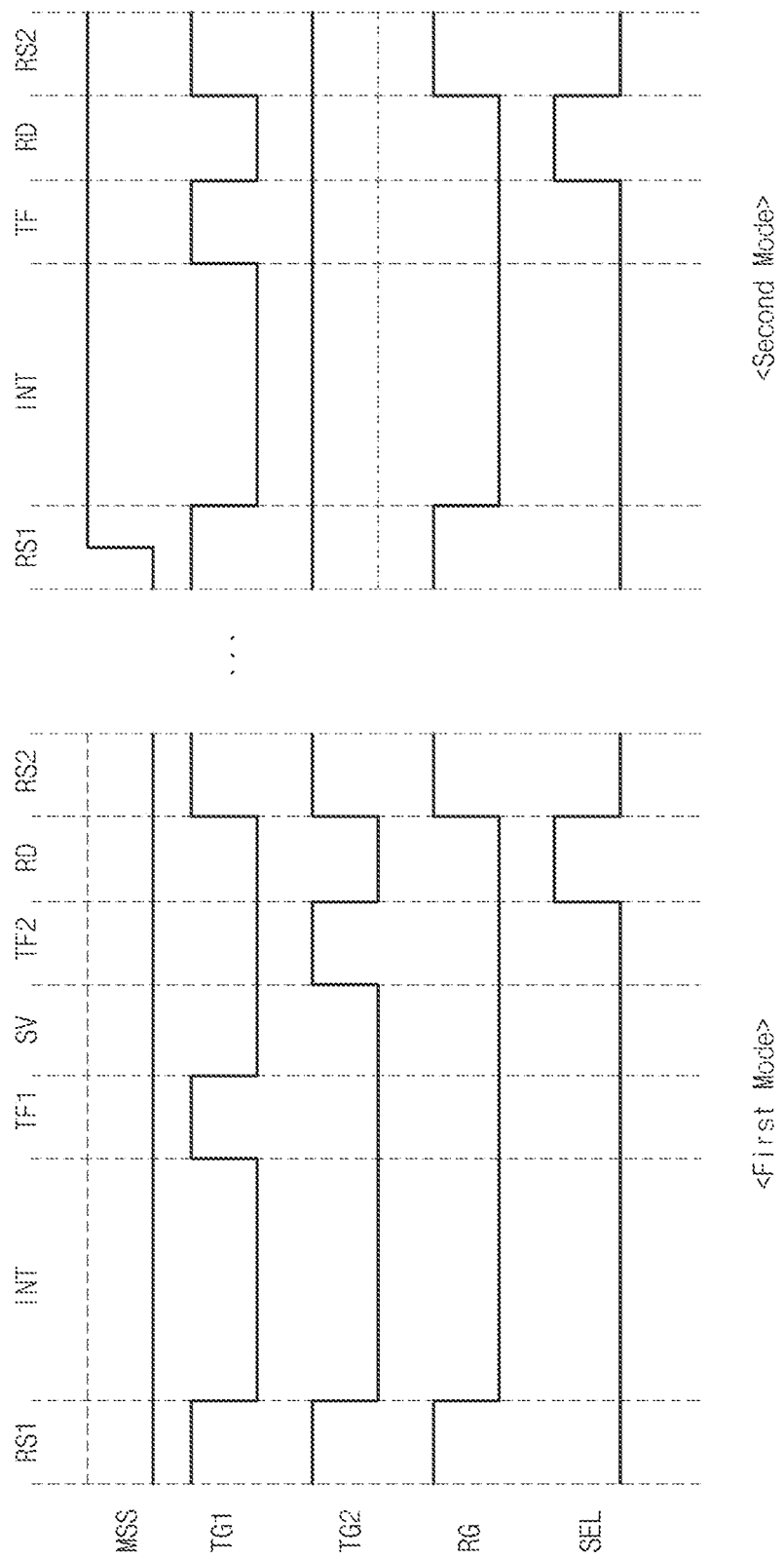
FIG. 5 is a timing diagram illustrating a control method for operating a pixel illustrated in FIG. 4 in a first mode and a second mode.
Figure 6:
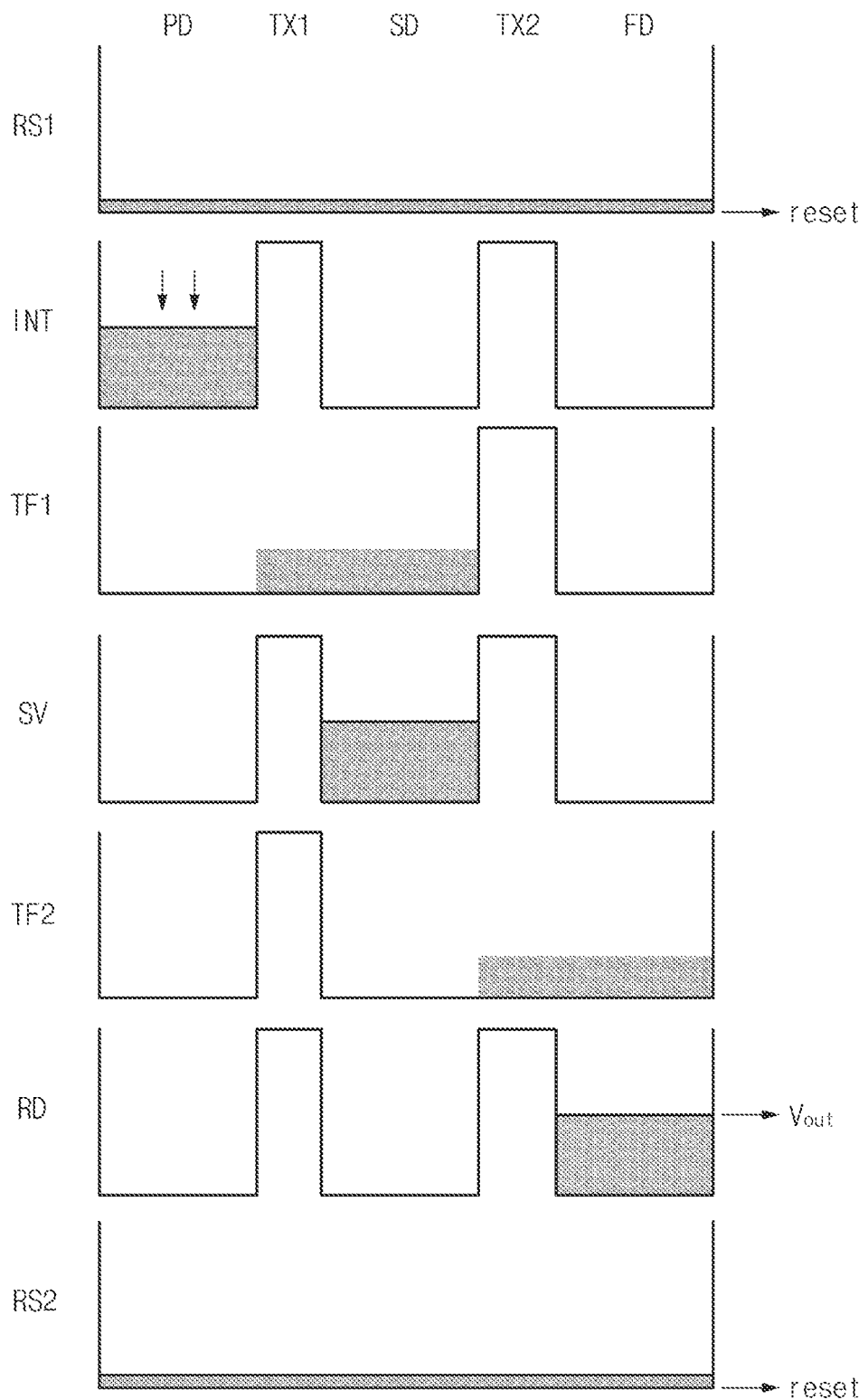
FIG. 6 is a diagram illustrating a potential distribution of a pixel illustrated in FIG. 4 in each section of a first mode.
Figure 7:
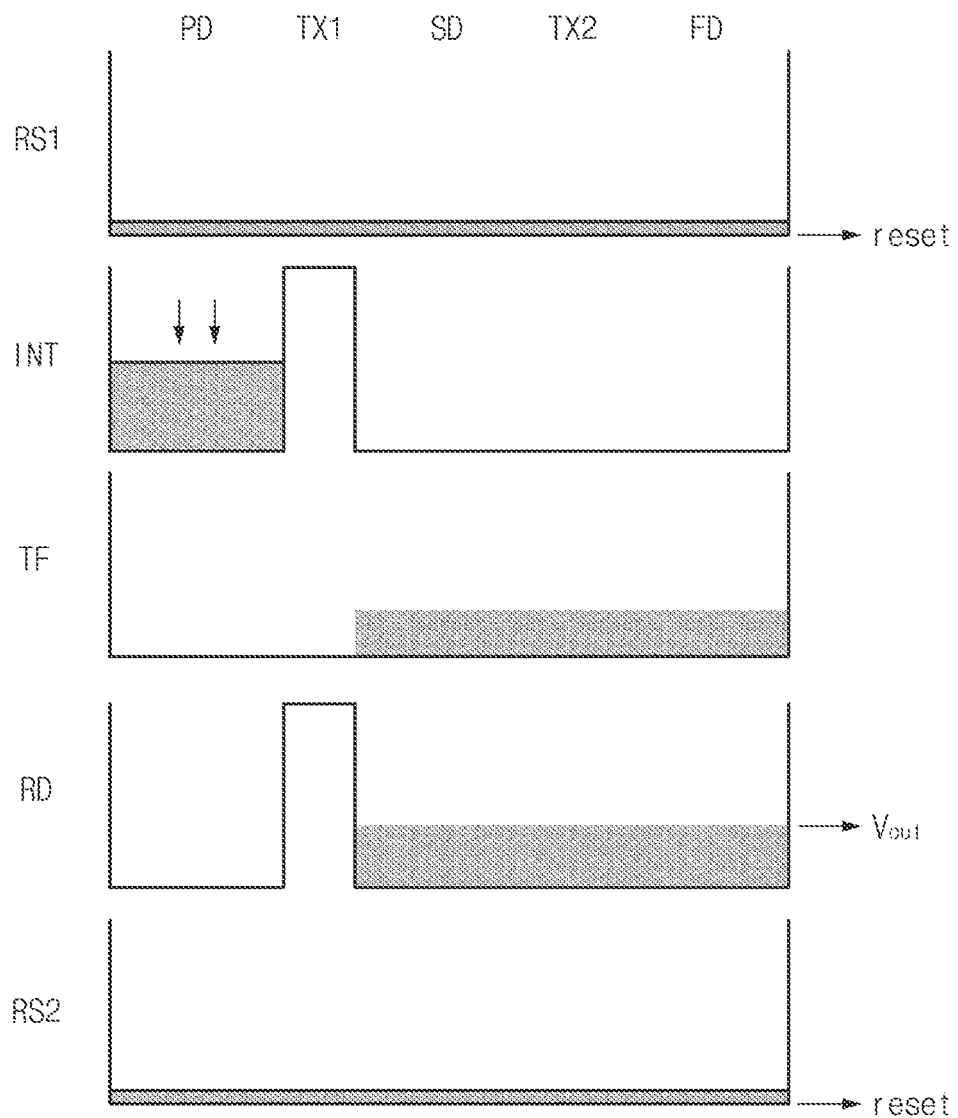
FIG. 7 is a diagram illustrating a potential distribution of a pixel illustrated in FIG. 4 in each section of the second mode.

FIG. 5 is a timing diagram illustrating a control method for operating the pixel illustrated in FIG. 4 in the first mode and the second mode. FIG. 6 is a diagram illustrating potential distribution of the pixel illustrated in FIG. 4 in each section of the first mode. FIG. 7 is a diagram illustrating potential distribution of the pixel illustrated in FIG. 4 in each section of the second mode.

FIG. 5 illustrates control signals MSS, TG1, TG2, RG and SEL for controlling the pixel PX-1 illustrated in FIG. 4. Each of the control signals MSS, TG1, TG2, RG and SEL may have two kinds of logic levels, i.e. a logic high level and a logic low level, and each of the transistors TX1, TX2, RX and SX may be turned on when a logic high signal is applied to the gate thereof, and turned off when a logic low signal is applied to the gate thereof.

The mode selection signal MSS is a signal for deciding the operation mode of the image sensor 100, and the timing controller 170 may generate the control signals TG1, TG2, RG and SEL corresponding to the first mode on the left side of FIG. 5 according to the logic-low mode selection signal MSS. Furthermore, the timing controller 170 may generate the control signals TG1, TG2, RG and SEL corresponding to the second mode on the right side of FIG. 5 according to the logic-high mode selection signal MSS.

On the left side of FIG. 5, the control signals TG1, TG2, RG and SEL for operating the pixel PX-1 in the first mode according to the logic-low mode selection signal MSS are illustrated. The operation sections of the first mode may include a reset section RS1, a photo-electric charge accumulation section INT, a first transfer section TF1, a storage section SV, a second transfer section TF2, a read section RD and a reset section RS2. FIG. 6 illustrates potential distribution in each of the operation sections of the first mode. Hereafter, the operation of the pixel PX-1 in the first mode will be described with reference to FIGS. 5 and 6.

In the reset section RS1, the first transfer signal TG1, the second transfer signal TG2 and the reset signal RG may correspond to logic high, and the selection signal SEL may correspond to logic low. Thus, the first transfer transistor TX1, the second transfer transistor TX2 and the reset transistor RX may be turned on, and the selection transistor SX may be turned off. Photo-electric charge remaining in the photodiode PD, the first transfer transistor TX1, the storage diode SD, the second transfer transistor TX2 and the floating diffusion region FD may be reset to the supply voltage Vdd. The present embodiment is described under the supposition that the potentials of the photodiode PD, the storage diode SD and the floating diffusion region FD are equal to one another. However, the potentials of the photodiode PD, the storage diode SD and the floating diffusion region FD may have a relation of (potential of photodiode PD>potential of storage diode SD>potential of floating diffusion region FD), such that the photo-electric charge is smoothly transferred through a constant potential slope.

In the photo-electric charge accumulation section INT, the first transfer signal TG1, the second transfer signal TG2, the reset signal RG and the selection signal SEL may correspond to logic low. Thus, the first transfer transistor TX1, the second transfer transistor TX2, the reset transistor RX and the selection transistor SX may be turned off. The photodiode PD may generate and accumulate photo-electric charge corresponding to the intensity of incident ray.

In the first transfer section TF1, the first transfer signal TG1 may correspond to logic high, and the second transfer signal TG2, the reset signal RG and the selection signal SEL may correspond to logic low. Thus, the first transfer transistor TX1 may be turned on, the second transfer transistor TX2, the reset transistor RX and the selection transistor SX may be turned off. As the first transfer transistor TX1 is turned on, the photo-electric charge, accumulated in the photodiode PD, may be transferred to the storage diode SD.

In the storage section SV, the first transfer signal TG1, the second transfer signal TG2, the reset signal RG and the selection signal SEL may correspond to logic low. Thus, the first transfer transistor TX1, the second transfer transistor TX2, the reset transistor RX and the selection transistor SX may be turned off. The storage diode SD may store the photo-electric charge transferred through the first transfer transistor TX.

In the second transfer section TF2, the second transfer signal TG2 may correspond to logic high, and the first transfer signal TG1, the reset signal RG and the selection signal SEL may correspond to logic low. Thus, the second transfer transistor TX2 may be turned on, and the first transfer transistor TX1, the reset transistor RX and the selection transistor SX may be turned off. As the second transfer transistor TX2 is turned on, the photo-electric charge stored in the storage diode SD may be transferred to the floating diffusion region FD.

In the read section RD, the selection signal SEL may correspond to logic high, and the first transfer signal TG1, the second transfer signal TG2 and the reset signal RG may correspond to logic low. Thus, the selection transistor SX may be turned on, and the first transfer transistor TX1, the second transfer transistor TX2 and the reset transistor RX may be turned off. As the selection transistor SX is turned on, the output voltage Vout corresponding to the photo-electric charge stored in the floating diffusion region FD having a storage capacity corresponding to the junction capacitor Cfd may be outputted through the signal output line. In this case, the photo-electric charge accumulated in the floating diffusion region FD having a relatively small storage capacity may be converted into the output voltage Vout. Thus, the ratio of photo-electric charge converted into the output voltage Vout may be relatively high (high conversion gain).

In the reset section RS2, the first transfer signal TG1, the second transfer signal TG2 and the reset signal RG may correspond to logic high, and the selection signal SEL may correspond to logic low. Thus, the first transfer transistor TX1, the second transfer transistor TX2 and the reset transistor RX may be turned on, and the selection transistor SX may be turned off. Photo-electric charge remaining in the photodiode PD, the first transfer transistor TX1, the storage diode SD, the second transfer transistor TX2 and the floating diffusion region FD may be reset to the supply voltage Vdd.

As described above, the first mode indicates an operation mode in which each of the pixels operates according to the global shutter method and the SCG method. That is, all the pixels of the pixel array 110 may simultaneously generate and store photo-electric charge for the same scene through the photo-electric charge accumulation section INT and the first transfer section TF1 which have the same start point and the same end point. The pixel PX-1 may transfer the stored photo-electric charge to the floating diffusion region FD and generate the output voltage Vout at a time point corresponding to the order of the pixel PX-1. Since the floating diffusion region FD has a storage capacity corresponding to the junction capacitor Cfd, the output voltage Vout of the pixel PX-1 has the high conversion gain.

That is, the pixels of the pixel array 110 may capture scenes at the same time, temporarily store the generated photo-electric charge, sequentially convert the photo-electric charge into the output voltage according to the high conversion gain, and output the output voltage.

On the right side of FIG. 5, the control signals TG1, TG2, RG and SEL for operating the pixel PX-1 in the second mode according to the logic-high mode selection signal MSS are illustrated. The operation sections of the second mode may include the reset section RS1, the photo-electric charge accumulation section INT, the transfer section TF, the read section RD and the reset section RS2. FIG. 7 illustrates potential distribution in each of the operation sections of the second mode. Hereafter, the operation of the pixel PX-1 in the second mode will be described with reference to FIGS. 5 and 7.

In the reset section RS1, the first transfer signal TG1, the second transfer signal TG2 and the reset signal RG may correspond to logic high, and the selection signal SEL may correspond to logic low. Thus, the first transfer transistor TX1, the second transfer transistor TX2 and the reset transistor RX may be turned on, and the selection transistor SX may be turned off. Photo-electric charge remaining in the photodiode PD, the first transfer transistor TX1, the storage diode SD, the second transfer transistor TX2 and the floating diffusion region FD may be reset to the supply voltage Vdd. The mode selection signal MSS may transition from logic low to logic high in the reset section RS1. Thus, the operation mode of the image sensor 100 may be changed from the first mode to the second mode. The reason why the mode selection signal MSS transitions in the reset section RS1 is in order to prevent a malfunction of the pixel PX-1 in the current frame by changing the operation mode before the accumulation of photo-electric charge is started, unlike the other operation modes.

In the photo-electric charge accumulation section INT, the second transfer signal TG2 may correspond to logic high, and the first transfer signal TG1, the reset signal RG and the selection signal SEL may correspond to logic low. Thus, the second transfer transistor TX2 may be turned on, the first transfer transistor TX1, the reset transistor RX and the selection transistor SX may be turned off. The photodiode PD may generate and accumulate photo-electric charge corresponding to the intensity of incident ray.

In the transfer section TF, the first transfer signal TG1 and the second transfer signal TG2 may correspond to logic high, and the reset signal RG and the selection signal SEL may correspond to logic low. Thus, the first transfer transistor TX1 and the second transfer transistor TX2 may be turned on, and the reset transistor RX and the selection transistor SX may be turned off. As the first and second transfer transistors TX1 and TX2 are turned on, the photo-electric charge accumulated in the photodiode PD may be transferred to the floating diffusion region FD.

In the read section RD, the second transfer signal TG2 and the selection signal SEL may correspond to logic high, and the first transfer signal TG1 and the reset signal RG may correspond to logic low. Thus, the second transfer transistor TX2 and the selection transistor SX may be turned on, and the first transfer transistor TX1 and the reset transistor RX may be turned off. As the second transfer transistor TX2 and the selection transistor SX are turned on, the output voltage Vout corresponding to the photo-electric charge accumulated in the floating diffusion region FD having a storage capacity corresponding to the storage diode SD and the junction capacitor Cfd may be outputted through the signal output line. Since the photo-electric charge accumulated in the floating diffusion region FD having a relatively large storage capacity is converted into the output voltage Vout, the ratio of the photo-electric charge converted into the output voltage Vout may be relatively low (low conversion gain).

In the reset section RS2, the first transfer signal TG1, the second transfer signal TG2 and the reset signal RG may correspond to logic high, and the selection signal SEL may correspond to logic low. Thus, the first transfer transistor TX1, the second transfer transistor TX2 and the reset transistor RX may be turned on, and the selection transistor SX may be turned off. Photo-electric charge remaining in the photodiode PD, the first transfer transistor TX1, the storage diode SD, the second transfer transistor TX2 and the floating diffusion region FD may be reset to the supply voltage Vdd.

As described above, the second mode indicates an operation mode in which each of the pixels operates according to the rolling shutter method and the DCG (or low conversion gain) method. That is, all the pixels of the pixel array 110 may sequentially generate and store photo-electric charge for the same scene through the photo-electric charge accumulation sections INT which have different start points and different end points. The pixel PX-1 may transfer the accumulated photo-electric charge to the floating diffusion region FD and generate the output voltage Vout at a time point corresponding to the order of the pixel PX-1. Since the floating diffusion region FD has a storage capacity corresponding to the junction capacitor Cfd and the storage diode SD, the output voltage Vout of the pixel PX-1 has the low conversion gain.

That is, the pixels of the pixel array 110 may sequentially capture the scene, sequentially convert the photo-electric charge into the output voltage according to the low conversion gain, and output the output voltage.

In order to generate an HDR image, the pixels of the pixel array 110 may sequentially capture a scene, convert photo-electric charge into an output voltage according to the high conversion gain, and output the output voltage. FIGS. 5 and 7 do not illustrate a timing diagram and potential distribution which are related to the operation of the pixel PX-1 according to the high conversion gain in the second mode. However, the timing diagram related to the operation of the pixel PX-1 according to the high conversion gain may be configured in the same manner as the timing diagram illustrated on the right side of FIG. 5, except the second transfer signal TG2. That is, in the timing diagram related to the operation of the pixel PX-1 according to the low conversion gain in the second mode illustrated on the right side of FIG. 5, the second transfer signal TG2 may correspond to logic high in the entire sections. However, in the timing diagram related to the operation of the pixel PX-1 according to the high conversion gain, the second transfer signal TG2 may have the same waveform as the first transfer signal TG1. Therefore, the first and second transfer transistors TX1 and TX2 operate in the same manner, and the second transfer transistor TX2 is turned off in the read section such that the floating diffusion region FD has a storage capacity corresponding to the junction capacitor Cfd. Thus, the output voltage Vout of the pixel PX-1 has the high conversion gain.

Figure 8:
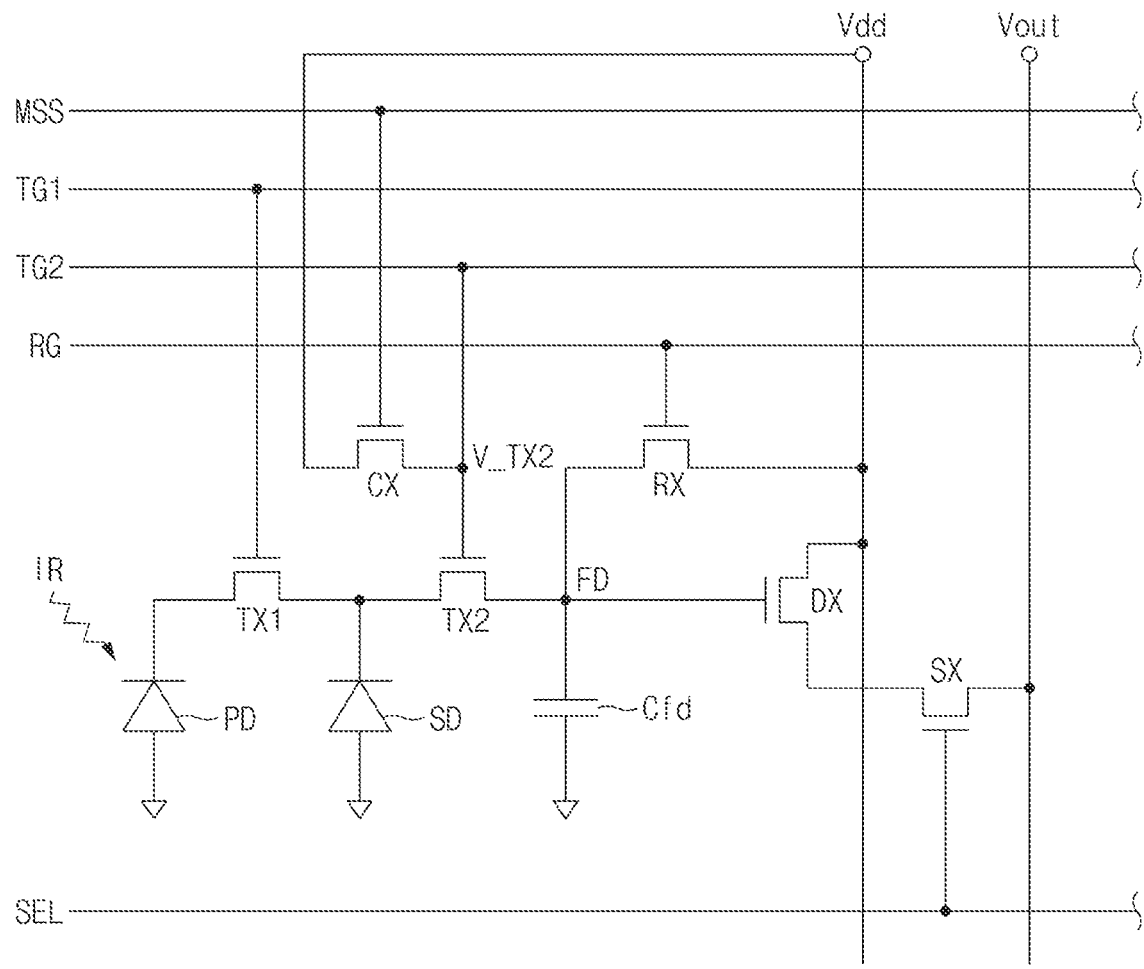
FIG. 8 is a diagram illustrating another example of an equivalent circuit of a pixel included in a pixel array illustrated in FIG. 1.

FIG. 8 is a diagram illustrating another example of an equivalent circuit of a pixel included in the pixel array illustrated in FIG. 1.

Referring to FIG. 8, a pixel PX-2 may correspond to a random unit pixel included in the pixel array 110. The pixel PX-2 may be a 6-TR pixel including a photodiode PD, a first transfer transistor TX1, a storage diode SD, a second transfer transistor TX2, a transfer control transistor CX, a floating diffusion region FD, a reset transistor RX, a drive transistor DX and a selection transistor SX.

Compared to the pixel PX-1 of FIG. 4, the pixel PX-2 further includes the transfer control transistor CX, and the other components are configured and operated in substantially the same manner as those of the pixel PX-1 of FIG. 4. Thus, the overlapping descriptions will be omitted herein.

The transfer control transistor CX may be coupled between the supply voltage Vdd and the second transfer transistor TX2, and receive the mode selection signal MSS through a gate thereof. The transfer control transistor CX may be turned on according to the mode selection signal MSS corresponding to logic high, or turned off according to the mode selection signal MSS corresponding to logic low. That is, the timing controller 170 may supply the received mode selection signal MSS to the pixel PX-2 by bypassing the mode selection signal MSS.

That is, when the mode selection signal MSS is logic low (first mode), the transfer control transistor CX may be turned off. As the transfer control transistor CX is turned off, the second transfer signal TG2 may be inputted to the gate of the second transfer transistor TX2. Thus, the gate voltage V_TX2 of the second transfer transistor TX2 may have the same waveform as the second transfer signal TG2.

When the mode selection signal MSS is logic high (second mode), the transfer control transistor CX may be turned on. As the transfer control transistor CX is turned on, the supply voltage Vdd may be forcibly inputted to the gate of the second transfer transistor TX2, and thus the gate voltage V_TX2 of the second transfer transistor TX2 may be equal to the supply voltage Vdd. The supply voltage Vdd may correspond to a logic high level that can turn on the second transfer transistor TX2. Therefore, when the mode selection signal MSS is logic high, the second transfer transistor TX2 may be turned on.

FIG. 9 is a timing diagram illustrating a control method for operating the pixel illustrated in FIG. 8 in the first mode and the second mode.

FIG. 9 illustrates the control signals MSS, TG1, TG2, RG and SEL for controlling the pixel PX-2 illustrated in FIG. 8 and the gate voltage V_TX2 of the second transfer transistor TX2. Each of the control signals MSS, TG1, TG2, RG and SEL and the gate voltage V_TX2 may have two kinds of logic levels, i.e. a logic high level and a logic low level, and each of the transistors TX1, TX2, RX and SX may be turned on when a logic high signal is applied to a gate thereof, and turned off when a logic low signal is applied to the gate thereof.

The timing controller 170 may generate the same control signals TG1, TG2, RG and SEL as the control signals TG1, TG2, RG and SEL corresponding to the first mode on the left side of FIG. 5, regardless of the mode selection signal MSS.

On the left side of FIG. 9, the gate voltage V_TX2 of the second transfer transistor TX2 and the control signals TG1, TG2, RG and SEL for operating the pixel PX-2 in the first mode according to the logic-low mode selection signal MSS are illustrated. As described above, the transfer control transistor CX which receives the logic-low mode selection signal MSS in the first mode may be turned off, and thus the gate voltage V_TX2 of the second transfer transistor TX2 may be equal to the second transfer signal TG2. That is, the control signals inputted to the respective transistors TX1, TX2, RX and SX in the first mode of FIG. 9 may be equal to the control signals TG1, TG2, RG and SEL in the first mode of FIG. 5. Therefore, the pixel PX-2 may operate in the same manner as the pixel PX-1 according to the potential distribution and the operation sections of the first mode described with reference to FIG. 6.

On the right side of FIG. 9, the gate voltage V_TX2 of the second transfer transistor TX2 and the control signals TG1, TG2, RG and SEL for operating the pixel PX-2 in the second mode according to the logic-high mode selection signal MSS are illustrated. As described above, the transfer control transistor CX which receives the logic-high mode selection signal MSS in the second mode may be turned on, and thus the gate voltage V_TX2 of the second transfer transistor TX2 may be the supply voltage Vdd corresponding to logic high. That is, the control signals inputted to the respective transistors TX1, TX2, RX and SX in the second mode of FIG. 9 may be substantially equal to the control signals TG1, TG2, RG and SEL in the second mode of FIG. 5. In the second mode of FIG. 5, the state in which the first transfer signal TG1 is logic high may last during the transfer section TF. In the second mode of FIG. 9, however, the state in which the first transfer signal TG1 is logic high may be retained only in a part of the transfer section TF. This is because the timing controller 170 does not generate the separate control signals TG1, TG2, RG and SEL for the first and second modes, but implements the operations of the first and second modes using the mode selection signal MSS and the transfer control transistor CX within the pixel PX-2. The pixel PX-2 may operate in substantially the same manner as the pixel PX-1 according to the potential distribution and the operation sections of the second mode described with reference to FIG. 7.

By implementing the operations of the first and second modes using the mode selection signal MSS and the transfer control transistor CX within the pixel PX-2, the timing controller 170 does not need to independently generate the control signals of the first mode and the control signals of the second mode according to the mode selection signal MSS. Thus, the timing controller 170 may not include an additional circuit for such an operation.

In FIG. 9, the same control signals TG1, TG2, RG and SEL are used in the first and second modes. Thus, a time interval between the reset sections RS1 and RS2 in the first mode (a time interval until RS2 is started after RS1 is ended) may be equal to a time interval between the reset sections RS1 and RS2 in the second mode. In FIG. 5, however, different control signals TG1, TG2, RG and SEL may be generated in the first and second modes. Therefore, a time interval between the reset sections RS1 and RS2 in the first mode may be different from a time interval between the reset sections RS1 and RS2 in the second mode. That is, the time required for the photo-electric charge accumulation section INT in the first mode may be set to a shorter time than in the second mode, or the time required for the transfer section TF in the second mode may be set to a shorter time than the entire transfer time TF1+SV+TF2 of the second mode.

In a conventional art, in order for a pixel to have both of the global shutter function and the DCG function, the pixel requires two or more storage elements. Such additional elements in the pixel make the fabrication process more complicated and increase more damages to a substrate. Thus, noise may also increase as well. Furthermore, as the elements are added into the pixel having a limited area, the available areas for other elements may be reduced. Such a reduction in the available areas may act as a direct factor that degrades the pixel performance. Furthermore, as the areas of the respective elements are reduced, the element characteristics may be degraded by the influence of the short-channel effect on transistors, and the insulating characteristic between adjacent elements may also be degraded.

The disclosed technology provide various implementations to provide an image sensor that can implement both of the global shutter function and the DCG function using only one additional storage element in the pixel. For this, in the first mode the additional storage element (e.g. storage diode) temporarily stores the photocharges before transferring the photocharges to the floating diffusion region, and in the second operation mode the additional storage element stores the photocharges while providing an additional storage capacity to the floating diffusion region.

Thus, while the pixel has both of the global shutter function and the DCG function, the size of the pixel can be minimized, and a margin for the areas of the other elements, e.g., transistors DX, RX and others, still can be secured, which makes it possible to improve the performance of the various elements in the pixel.

While various embodiments have been described above, it will be understood to those skilled in the art that the embodiments described are examples only and variations of the disclosed embodiments and other embodiments can be made based on what is disclosed and illustrated in this patent document.

What is claimed is:

1. An image sensor comprising:
    a pixel array including a plurality of pixels, each pixel structured to generate photocharges in response to incident light and including a floating diffusion region structured to accumulate the photocharges that is to be converted into an output voltage; and
    a controller coupled to communicate with the pixel array and structured to provide control signals to the pixel array to operate the pixel array in different first and second operation modes at different times in operating the pixel array to respond to incident light, wherein each pixel includes a storage element operable to store the photocharges generated by each pixel in either the first operation mode or the second operation mode based on the control signals, and wherein in the first operation mode the storage element stores the photocharges before transferring the photocharges to the floating diffusion region, and in the second operation mode the storage element stores the photocharges and provide an additional storage capacity to the floating diffusion region, and wherein the additional storage capacity is provided to the floating diffusion region while an output voltage corresponding to the photocharges accumulated in the floating diffusion region is output.

2. The image sensor of claim 1, wherein the first operation mode and the second operation mode have different gains on conversion of light into photocharges.

3. The image sensor according to claim 1, wherein each of the pixels comprises:
a photo-electric conversion element structured to generate the photocharges corresponding to an intensity of the incident light;
a first transfer transistor coupled between the photo-electric conversion element and the storage element, and structured to be turned on in response to a first transfer signal; and
a second transfer transistor coupled between the storage element and the floating diffusion region, and structured to be turned on in response to a second transfer signal.

4. The image sensor according to claim 3, wherein each of the pixels is structured during the first operation mode to operate following operating periods:
a photo-electric charge accumulation period in which the photo-electric conversion element generates and accumulates the photocharges;
a first transfer period in which the first transfer transistor transfers the photocharges to the storage element;
a storage period to store the photocharges in the storage element; and
a second transfer period in which the second transfer transistor transfers the photocharges to the floating diffusion region.

5. The image sensor according to claim 4, wherein the plurality of pixels is arranged in multiple rows and structured to simultaneously proceed each of the photo-electric charge accumulation period and the first transfer period.

6. The image sensor according to claim 4, wherein the operating periods further comprises a read period outputting the output voltage corresponding to the photocharges accumulated in the floating diffusion region, and
wherein the floating diffusion region has a storage capacity corresponding to a storage capacity of a junction capacitor coupled to the floating diffusion region.

7. The image sensor according to claim 3, wherein each of the pixels is structured during the second operation mode to operate following operating periods:
a photo-electric charge accumulation period in which the photo-electric conversion element generates and accumulates the photocharges; and
a transfer period in which the first transfer transistor transfers the photocharges to the floating diffusion region.

8. The image sensor according to claim 7, wherein the plurality of pixels is arranged in multiple rows and structured such that a photo-electric charge accumulation period of a pixel arranged on a nth row begins after a predetermined time from a beginning of a photo-electric charge accumulation period of a pixel arranged on a (n−1)th row, whereby n is an integer greater than 1.

9. The image sensor according to claim 7, wherein the operating periods further comprises a read period outputting the output voltage corresponding to the photocharges accumulated in the floating diffusion region, and
wherein the floating diffusion region has a storage capacity corresponding to a sum of a storage capacity of a junction capacitor coupled to the floating diffusion region and a storage capacity of the storage element.

10. The image sensor according to claim 3, further comprising a transfer control transistor coupled between a supply voltage node and a gate of the second transfer transistor, and structured to be turned on in response to a mode selection signal that selects the operation mode between the first operation mode and the second operation mode.

11. The image sensor according to claim 10, wherein the mode selection signal selecting the first operation mode corresponds to logic low, and the transfer control transistor is structured to be turned off to input the second transfer signal to a gate of the second transfer transistor.

12. The image sensor according to claim 10, wherein the mode selection signal selecting the second operation mode corresponds to logic high, and the transfer control transistor is turned on to input the supply voltage to a gate of the second transfer transistor.

13. A photographing apparatus comprising:
an image sensor comprising pixels each structured to operate in an operation mode that is one of a first mode in which the pixels operate according to a global shutter method and a second mode in which the pixels operate according to a dual conversion method; and
an image signal processor coupled to communicate with the image sensor and structured to determine which of the first mode and second mode to operate the image sensor and to generate a mode selection signal representing a determined mode out of the first and second modes,
wherein the image signal processor is structured to determine the operation mode based on a request from a user or data received from a sensing unit comprising at least one of a luminance sensor, an acceleration sensor, or a gyro sensor.

14. The photographing apparatus according to claim 13, wherein the image signal processor is structured to generate an image data and determine the operation mode based on the image data.

15. The photographing apparatus according to claim 13, wherein each of the pixels is structured to generate photocharges in response to an incident light and includes a storage element operable during both of the first mode and the second mode to store the photocharges.

16. The photographing apparatus according to claim 13, wherein the image sensor includes a controller coupled to the image signal processor to receive the mode selection signal and coupled to the image sensor to control the image sensor to operate in the determined mode based on the received mode selection signal.

17. A photographing apparatus comprising:
an image sensor comprising pixels each structured to operate in an operation mode that is one of a first mode in which the pixels operate according to a global shutter method and a second mode in which the pixels operate according to a dual conversion method; and an image signal processor coupled to communicate with the image sensor and structured to determine which of the first mode and second mode to operate the image sensor and to generate a mode selection signal representing a determined mode out of the first and second modes, wherein each of the pixels is structured to generate photocharges in response to an incident light and includes a storage element operable during both of the first mode and the second mode to store the photocharges, wherein each pixel is structured to include a floating diffusion region storing the photocharges and having a storage capacity corresponding to 1) a sum of a storage capacity of a junction capacitor coupled to the floating diffusion region and a storage capacity of the storage element or 2) the storage capacity of the junction capacitor.

18. The photographing apparatus according to claim 17, wherein the first mode and the second mode have different gains on conversion of light into photocharges.

19. The photographing apparatus according to claim 17, wherein each of the pixels comprises:
- a photo-electric conversion element structured to generate the photocharges; and
- a floating diffusion region structured to accumulate the photocharges that is to be converted into an output voltage.

20. The photographing apparatus according to claim 17, wherein each of the pixels comprises:
- a first transfer transistor coupled between the photo-electric conversion element and the storage element, and structured to be turned on in response to a first transfer signal; and
- a second transfer transistor coupled between the storage element and the floating diffusion region, and structured to be turned on in response to a second transfer signal.

* * * * *